(12) United States Patent
Heemstra et al.

(10) Patent No.: US 7,759,600 B2
(45) Date of Patent: Jul. 20, 2010

(54) RUPTURE RESISTANT PLASMA TUBE

(75) Inventors: David Heemstra, Hutto, TX (US);
Kevin White, Round Rock, TX (US)

(73) Assignees: Samsung Austin Semiconductor, L.P., Austin, TX (US); Samsung Electronics Co., Ltd., Suwon-si (KR)

(*) Notice: Subject to any disclaimer, the term of this patent is extended or adjusted under 35 U.S.C. 154(b) by 494 days.

(21) Appl. No.: 11/375,992

(22) Filed: Mar. 15, 2006

(65) Prior Publication Data
US 2007/0215281 A1 Sep. 20, 2007

(51) Int. Cl.
*B23K 10/00* (2006.01)
(52) U.S. Cl. .......... 219/121.5; 219/75; 219/121.48; 219/121.52
(58) Field of Classification Search ........ 219/121.5, 219/121.52, 121.48, 121.59, 75; 315/111.51
See application file for complete search history.

(56) References Cited

U.S. PATENT DOCUMENTS

| | | | | |
|---|---|---|---|---|
| 4,551,609 A | * | 11/1985 | Falk | 219/121.52 |
| 4,665,296 A | * | 5/1987 | Iwata et al. | 219/121.52 |
| 5,846,883 A | * | 12/1998 | Moslehi | 438/711 |
| 5,861,200 A | * | 1/1999 | Rowley | 428/36.9 |
| 5,928,461 A | * | 7/1999 | Kaufman et al. | 156/345.49 |
| 6,156,993 A | * | 12/2000 | Inoue et al. | 219/121.36 |
| 6,163,007 A | | 12/2000 | Tanaka et al. | |

FOREIGN PATENT DOCUMENTS

| | | |
|---|---|---|
| KR | 10-2000-56357 A | 9/2000 |
| KR | 1020010036006 A | 5/2001 |
| KR | 10-2001-98778 A | 11/2001 |
| KR | 1020050070612 A | 7/2005 |

* cited by examiner

Primary Examiner—Mark H Paschall

(57) ABSTRACT

A system for producing plasma tubes that can withstand a wide variety of physical and environmental stressors within a plasma processing system is disclosed. Within such a plasma processing system, a plasma tube structure has a central body portion—having a fixed outer diameter. At a first end of the plasma tube structure, an outwardly extending flange may be provided. At a second end of the plasma tube, an edge portion is provided—having an outer diameter that is less than the fixed outer diameter of the central body portion. The edge portion is formed to facilitate easy and secure engagement of the plasma tube structure with a compression mechanism. The plasma tube structure is formed of material that provides sufficient structural integrity and degradation resistance.

20 Claims, 1 Drawing Sheet

RUPTURE RESISTANT PLASMA TUBE

TECHNICAL FIELD OF THE INVENTION

The present application relates generally to semiconductor manufacturing processes and, more specifically, to apparatus and methods for improving plasma processing by providing a rupture resistant plasma tube.

BACKGROUND OF THE INVENTION

Gas phase plasma technology has numerous applications in electronic manufacturing—in products ranging from semiconductor devices to optoelectronic components. Plasma processes are commonly utilized to modify the physical or material properties of a structure at some point in the manufacturing process. Contamination removal, surface activation, and etch processes are among some of the common applications for plasma processes.

Depending upon the specific requirements or limitations of a given manufacturing process, a wide variety of gases and materials may be utilized in the formation and application of a plasma. Consider, for example, a plasma etch process utilized in a semiconductor manufacturing process. Commonly, a feed or source gas is conducted through a flow tube to a reaction area. While moving through the flow tube, the reactivity of the source gas is increased by exposing the source gas to a microwave or radio frequency power source—creating a plasma. Given its extreme and volatile nature, such a process is usually operated within some sort of vacuum environment.

Commonly, such systems utilize quartz tubes. Conventionally, quartz tubes have been easy to manufacture. The extent to which quartz tubes have withstood the environmental stresses of plasma systems has varied, however. To a certain extent, exposure to a plasma process gradually degrades the structural integrity of a quartz tube.

Extended use in a system can cause the wall of a tube to wear thin and rupture. Newer manufacturing and plasma materials have further accelerated the degradation of the usable life of quartz tubes. For example, the introduction of $CF_4$ into plasma systems can cause a chemical etching of the inside of a quartz tube—weakening the tube even faster than normal.

In addition to degradation of tube material, there are certain mechanical stressors in conventional plasma systems that damage or destroy conventional quartz plasma tubes. Conventional quartz tubes commonly comprise a single thickness tube having a flange portion at one end. That flange portion typically engages with some portion of the apparatus, while the un-flanged end of the tube is engaged with some sort of clamping mechanism to hold it in place—a compression ring fitting, for example.

As the system is pumped down to create a vacuum, the tube and its surrounding components are compressed together. If, however, there is any misalignment of the tube with respect to the components it engages, a bending moment or movement of the tube may result. This can cause a fracture or rupture of the tube, or unevenly expose the tube to a power source, further weakening or damaging the tube. In other instances, tube misalignment can cause some degree of melting in portions of the tube that are too close to an energy source (e.g., RF coil).

In addition to damage done to the tubes themselves, failures or faults in a tube can also do extensive damage to other components within a plasma system. For example, a rupture in a conventional quartz tube can result in arcing between the tube and an external RF coil. Aside from potentially ruining the plasma process, this can also cause damage to the RF coil—increasing system down time and repair expenses.

It appears that some conventional systems have attempted to address misalignment issues using supplemental mechanical apparatus. In some cases, support jigs or superstructures have been added to plasma systems to force a desired physical alignment of a plasma tube. Unfortunately, such measures add to the cost of the system, and introduce a number of reliability and maintenance variables to system operation.

As a result, there is a need for a system that provides plasma tubes that can withstand a wide variety of physical and environmental stressors within a plasma generation system, without relying upon supplemental support structures—providing efficient and reliable plasma processing in an easy and cost-effective manner.

SUMMARY OF THE INVENTION

A versatile system, comprising various apparatus and methods, provides plasma tubes that can withstand a wide variety of physical and environmental stressors within a plasma processing system. The plasma tubes of the present system are formed of material that is resistant to degradation and damage, even with newer manufacturing and plasma materials. Plasma tubes of the present system are provided with a form factor that obviates the need for supplemental support structures, and minimizes or obviates damage due to misalignment. The present system thus reduces plasma system failures and improves plasma processing reliability.

Specifically, constructs and methods for producing plasma tubes that can withstand a wide variety of physical and environmental stressors within a plasma processing system are disclosed. Within such a system, a plasma tube structure has a central body portion—having a fixed outer diameter. At a first end of the plasma tube structure, an outwardly extending flange may be provided. At a second end of the plasma tube, an edge portion is provided—having an outer diameter that is less than the fixed outer diameter of the central body portion. The edge portion is formed to facilitate easy and secure engagement of the plasma tube structure with a compression mechanism. The plasma tube structure is formed of material that provides sufficient structural integrity and degradation resistance.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
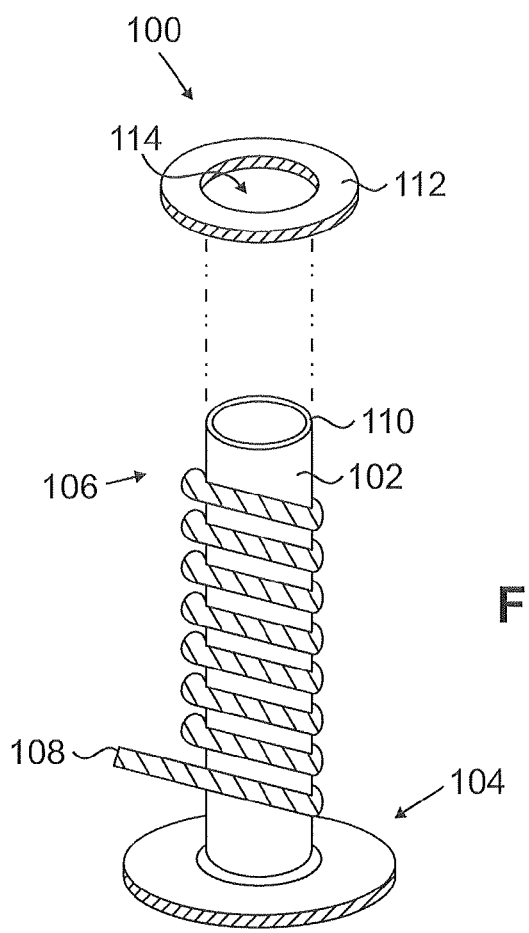
FIG. 1 depicts one embodiment of a plasma processing system illustrating certain aspects of the present invention.
Figure 2:
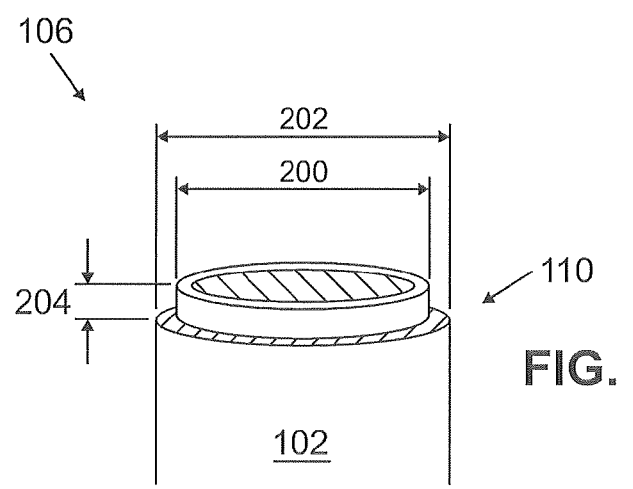
FIG. 2 depicts one embodiment of a plasma tube structure illustrating certain aspects of the present invention.

FIGS. 1 and 2, discussed below, and the various embodiments used to describe the principles of the present disclosure in this patent document are by way of illustration only, and should not be construed in any way to limit the scope of the disclosure. Hereinafter, certain aspects of the present disclosure are described in relation to illustrative embodiments of plasma processing systems and tools—particularly those utilized in semiconductor manufacturing processes. Those skilled in the art, however, will understand that the principles and teachings of the present disclosure may be implemented in any suitably arranged plasma processing system—whether or not such system utilizes the same materials or components, or is used in a semiconductor or other manufacturing or processing system.

The following discloses a versatile system—comprising various apparatus and methods—that provides plasma tubes capable of withstanding a wide variety of physical and environmental stressors within a plasma generation system. The plasma tubes of the present system are formed of material (e.g., $Al_2O_3$-based ceramic, sapphire) that is resistant to plasma-induced degradation and damage—even where newer manufacturing and plasma materials are used. Plasma tubes of the present system are provided with a form factor that obviates the need for supplemental support structures, and minimizes or obviates tube damage that can occur as a result of misalignment.

Specifically, constructs and methods for producing ceramic plasma tubes having a reduced "collar" area are disclosed. A plasma tube is produced having a flanged end and an open end. The tube is formed or machined such that, around the perimeter of its open end, outer diameter is reduced with respect to the outer diameter of the remainder of the tube. As plasma chamber pump down occurs, the open end of the tube engages securely with a clamping apparatus while allowing for slight variances in fit or movement. The tube is formed of a ceramic material that is highly tolerant of modern plasma materials and system conditions.

Generally, plasma systems can vary widely in their configuration, operation, and source materials, and may be used in the preparation or modification of a number of materials—such as ceramics, polymers and metals. The basic architecture of such systems, however, is similar—a source gas is fed through a plasma tube, where it is exposed to some energy source, in a vacuum environment. To the extent that a plasma system utilizes such architecture, it may benefit from the system of the present invention.

For purposes of explanation and illustration, certain aspects of the present invention are described now in reference to a plasma system utilized to perform etch procedures in a semiconductor manufacturing environment. Such plasma systems are typically designed to provide a certain level of discharge reactivity. Etching utilizes a source gas that dissociates within the plasma, creating a mixture of highly reactive species. The chemical selectivity of the plasma may be optimized to selectively etch one material in the presence of other materials. For example, the dissociation of $CF_4$ (or $NF_3$ or $CHF_3$) and oxygen in appropriate concentrations can produce highly reactive oxy, oxy-fluoro, and fluoro radicals capable of breaking carbon-carbon bonds within numerous materials. The reaction of such radicals with the material being processed produces volatile by-products, which may then be removed from the vacuum system. This and similar processes may be used to—for example—oxidize a metallic surface at a desired stage in manufacturing.

One illustrative embodiment of a plasma system is described now in reference to FIG. 1, which depicts certain elements of a plasma system 100 according to the present invention. System 100 comprises a plasma tube 102, having a flanged portion or end 104 and an open portion or end 106. The central body portion of tube 102 is formed having a fixed outer diameter. Flanged portion 104 flares outwardly from the central body portion, and is formed to engage or mate with a compatibly shaped recess in the plasma system structure (not shown). System 100 further comprises a plasma energy source 108, depicted in this embodiment as an RF coil disposed about the perimeter and along the length of the central body portion of tube 102.

Portion 106 is formed with a collared neck or edge portion 110. Portion 110 is formed to facilitate the secure and stable engagement of portion 106 with a clamping or compression mechanism 112—without reliance on any supplemental alignment or support structures. Collared portion 110 is described in greater detail now with reference to FIG. 2, which depicts a closer view of end portion 106 of tube 102. Portion 110 provides a reduced outer diameter 200—with respect to outer diameter 202 of the remainder of tube 102—over some distance 204 at open end 106.

Referring now to FIGS. 1 and 2, the relative proportions of diameters 200 and 202, and distance 204, may be varied greatly to accommodate a wide range of systems requirements—such as the dimensions of a stock material from which tube 102 may be formed, or the physical dimensions of different compression mechanisms 112. Reduced outer diameter 202 and distance 204 may also be selected based upon the dimensions of an opening 114 in mechanism 112 with which portion 110 is intended to engage.

Distance 204 may be selected to allow engagement within opening 114 that is secure, without extending excessively into mechanism 112 from opening 114. In one embodiment, for example, distance 204 may be on the order of about 0.5 inches. Reduced outer diameter 200 may be selected to provide just sufficient tolerance of end 106 within opening 114, such that slight physical variances—in either tube 102 or mechanism 112—will not prevent the clear entry of end 106 into opening 114, as mechanism 112 is engaged or compressed. In one embodiment, for example, outer diameter 202 may be on the order of approximately 1.6 inches, while diameter 200 is on the order of approximately 1.57 inches. Depending upon the overall thickness of material from which tube 102 is formed, and its relative structural integrity at different thicknesses, the ratio of diameter 200 to diameter 202 may be varied substantially. Diameter 200 may also be selected to facilitate the use of a tube 102 having an outer diameter 202 substantially greater than opening 114 would otherwise accommodate.

Tube 102 may be formed of, or machined from, any suitable material that provides sufficient structural integrity and degradation resistance. In numerous embodiments, tube 102 serves as a vacuum barrier, and must therefore be formed of a material having sufficient density to prevent ingress or egress of plasma materials. The material from which tube 102 is formed must also be compatible with the materials upon which the plasma system will used, and with the materials utilized in the operation of that system.

In certain embodiments, for example, tube 102 may be formed of $Al_2O_3$-based ceramic. Dense $Al_2O_3$ material, of a grade compatible with semiconductor manufacturing, is readily available and may be readily machined in accordance with the present invention. The melting temperature of $Al_2O_3$ material—in comparison to conventional quartz material—is significantly higher, and $Al_2O_3$ material has a greater resistance to etching effects from reactive materials such as $CF_4$. As a result, $Al_2O_3$-based ceramic tubes fail less often, and require fewer replacements, than conventional quartz tubes. In alternative embodiments, tube 102 may be formed of sapphire. Sapphire tubes are generally more favorable to the passage of energy to the plasma, but may be more difficult to machine.

Given the foregoing description, those of skill in the art will recognize that a number of variations are comprehended hereby. In certain embodiments, for example, a tube may be provided with collared portions at both ends of the tube. In other embodiments, an incremental graduation of several reduced diameters may be provided. Some embodiments may provide a sharp, right-angled transition from outer diameter 202 to reduced diameter 200, while others provide an angled or rounded transition. These and other similar variations, and various combinations thereof, are comprehended hereby.

The embodiments and examples set forth herein are presented to best explain the present invention and its practical application, and to thereby enable those skilled in the art to make and utilize the system of the present disclosure. The description as set forth herein is therefore not intended to be exhaustive or to limit any invention to a precise form disclosed. As stated throughout, many modifications and variations are possible in light of the above teaching without departing from the spirit and scope of the following claims.

What is claimed is:

1. A plasma tube structure for use in a plasma processing system, the structure comprising:
    a central body portion, having a fixed outer diameter and surrounded by a radio frequency coil; and
    a first end of the tube, having a reduced outer diameter, the reduced outer diameter selected to allow the first end of the tube to securely engage with a compression mechanism in the plasma processing system, the first end of the tube having a smooth unthreaded outer surface along its entire length,
    wherein the structure is formed of a material that is resistant to plasma-induced degradation.

2. The structure of claim 1, wherein the plasma tube structure is formed of a ceramic material.

3. The structure of claim 2, wherein the plasma tube structure is formed of an $Al_2O_3$-based ceramic material.

4. The structure of claim 1, further comprising a second end having a flange extending outwardly from the central body portion.

5. The structure of claim 1, wherein the difference between the outer diameter and the reduced outer diameter is on the order of about 0.3 inches.

6. The structure of claim 1, wherein the reduced outer diameter extends, from the first end of the tube, a distance on the order of about 0.5 inches.

7. The structure of claim 1, wherein a transition between the outer diameter and the reduced outer diameter is angled.

8. The structure of claim 7, wherein a transition between the outer diameter and the reduced outer diameter is right-angled.

9. The structure of claim 1, wherein a transition between the outer diameter and the reduced outer diameter is rounded.

10. A method of using a plasma tube structure in a plasma processing system, the method comprising the steps of:
    providing a central body portion, having a first outer diameter;
    surrounding the central body portion with a radio frequency coil;
    providing a first end of the tube, having a flange extending outwardly from the central body portion;
    providing a second end of the tube, having an edge portion with a second outer diameter that is less than the first outer diameter, the second outer diameter selected to allow the second end of the tube to securely engage with a compression mechanism in the plasma processing system, the edge portion having a smooth unthreaded outer surface along its entire length; and
    coupling the second end of the tube to the compression mechanism,
    wherein the structure is formed of a material that is resistant to plasma-induced degradation.

11. The method of claim 10, wherein the plasma tube structure is formed of a ceramic material.

12. The method of claim 11, wherein the plasma tube structure is formed of an $Al_2O_3$-based ceramic material.

13. The method of claim 10, wherein the difference between the first and second outer diameters is on the order of about 0.3 inches.

14. The method of claim 10, wherein the edge portion is formed by machining the second end.

15. A plasma processing system comprising:
    a compression mechanism;
    a plasma tube structure, having a central body portion with a first outer diameter, having a first end with an outwardly extending flange, having a second end, and having an edge portion of the second end with a second outer diameter that is less than the first outer diameter, wherein the second outer diameter is selected to allow the second end of the tube to securely engage with the compression mechanism, wherein the edge portion of the second end has a smooth unthreaded outer surface along its entire length; and
    an energy source disposed about the perimeter and along the central body portion,
    wherein the plasma tube structure is formed of a material that is resistant to plasma-induced degradation.

16. The system of claim 15, wherein the plasma tube structure is formed of a ceramic material.

17. The system of claim 16, wherein the plasma tube structure is formed of an $Al_2O_3$-based ceramic material.

18. The system of claim 15, wherein the plasma processing system is used in semiconductor manufacturing.

19. The system of claim 15, wherein the energy source is an RF coil.

20. The system of claim 15, wherein the difference between the first and second outer diameters is on the order of about 0.3 inches.

* * * * *